(12) United States Patent
De Filippis

(10) Patent No.: US 10,862,375 B2
(45) Date of Patent: Dec. 8, 2020

(54) ROTARY ELECTRIC MACHINE

(71) Applicant: SPAL AUTOMOTIVE S.R.L., Correggio (IT)

(72) Inventor: Pietro De Filippis, Varazze (IT)

(73) Assignee: SPAL AUTOMOTIVE S.R.L., Correggio (IT)

(*) Notice: Subject to any disclaimer, the term of this patent is extended or adjusted under 35 U.S.C. 154(b) by 35 days.

(21) Appl. No.: 16/233,228

(22) Filed: Dec. 27, 2018

(65) Prior Publication Data

US 2019/0207486 A1 Jul. 4, 2019

(30) Foreign Application Priority Data

Dec. 28, 2017 (IT) .......................... 102017000150375

(51) Int. Cl.
*H02K 11/33* (2016.01)
*H05K 1/18* (2006.01)
*H05K 1/02* (2006.01)
*H05K 7/20* (2006.01)
*H02K 5/04* (2006.01)

(52) U.S. Cl.
CPC ............... *H02K 11/33* (2016.01); *H02K 5/04* (2013.01); *H05K 1/0296* (2013.01); *H05K 1/182* (2013.01); *H05K 7/209* (2013.01); *H02K 2211/03* (2013.01); *H05K 2201/0397* (2013.01); *H05K 2201/10007* (2013.01)

(58) Field of Classification Search
CPC ...... H02K 11/33; H02K 2211/03; H02K 5/04; H05K 1/0296; H05K 1/182; H05K 2201/0397; H05K 2201/10007; H05K 7/209

USPC ........................................................ 310/40 R
See application file for complete search history.

(56) References Cited

U.S. PATENT DOCUMENTS

2002/0159238 A1 10/2002 Gross et al.
2017/0309555 A1* 10/2017 Shimakawa ...... H01L 23/49541

FOREIGN PATENT DOCUMENTS

EP          3223307 A1   9/2017
WO    WO2013/008180 A2   1/2013

OTHER PUBLICATIONS

Italian Search Report dated Sep. 26, 2018 from counterpart Italian App No. 201700150375.

* cited by examiner

*Primary Examiner* — Alex W Mok
(74) *Attorney, Agent, or Firm* — Shuttleworth & Ingersoll, PLC; Timothy J. Klima

(57) ABSTRACT

A rotary electric machine including an electronic module which includes a printed circuit board and a plurality of electronic components, each of which is provided with respective connecting pins disposed on a component side of the printed circuit board; the electronic module includes at least one conductive track which includes a plurality of tabs, each configured to be connected to a respective connecting pin; the conductive track is positioned on the component side of the printed circuit board; the printed circuit board has at least one seat configured to house at least a first tab of the tabs in such a way that the top face of the first tab is coplanar with the component side of the printed circuit board.

12 Claims, 5 Drawing Sheets

ROTARY ELECTRIC MACHINE

This application claims priority to Italy Patent Application 102017000150375 filed Dec. 28, 2017, the entirety of which is incorporated by reference herein.

This invention relates to a rotary electric machine comprising a built-in electronic drive module.

A prior art rotary electric machine equipped with a built-in electronic drive module is described in patent application WO2013/008180 in the name of the present Applicant.

In that solution, the electronic module comprises a printed circuit board and a plurality of conductive tracks which implement the direct connections between all the electronic components.

More precisely, the conductive tracks define a plurality of electrical connections between electronic power components and electronic components.

In that solution, the conductive tracks are located on a second side, or soldering side, of the printed circuit board, opposite to the component side.

The conductive tracks comprise a plurality of connecting tabs and connecting pins soldered to the printed circuit board.

The printed circuit board, electronic components and conductive tracks together define the electronic module which makes up the drive circuit providing the suitably controlled power supply for the motor.

Nowadays, owing to inevitable developments in electronics, that solution can be improved, in particular in terms of electronic module structure thanks to advances in the technology of electronic components now available on the market, allowing assembly operations to be simplified.

In this context, a rotary electric machine has been developed whose electronic module comprises a printed circuit board and a plurality of electronic components, each of which is provided with respective connecting pins disposed on a component side of the printed circuit board.

The electronic module comprises at least one conductive track which comprises a plurality of tabs, each configured to be connected to a respective connecting pin.

The conductive track is positioned on the component side of the printed circuit board.

The printed circuit board has at least one seat configured to house at least a first tab of the plurality of tabs in such a way that the top face of the first tab is coplanar with the component side of the printed circuit board.

Advantageously, the conductive tracks are disposed only on the side of the printed circuit board where the components are disposed and no longer on the opposite side as in the case of the above mentioned prior art solution, thus making it possible to simplify electronic module assembly operations and to meet track/component assembly tolerances.

Other features and advantages of the invention are more apparent in the detailed description below, with reference to a non-limiting and non-exclusive preferred embodiment of a rotary electric machine, as illustrated in the accompanying drawings, in which.

Figure 1:
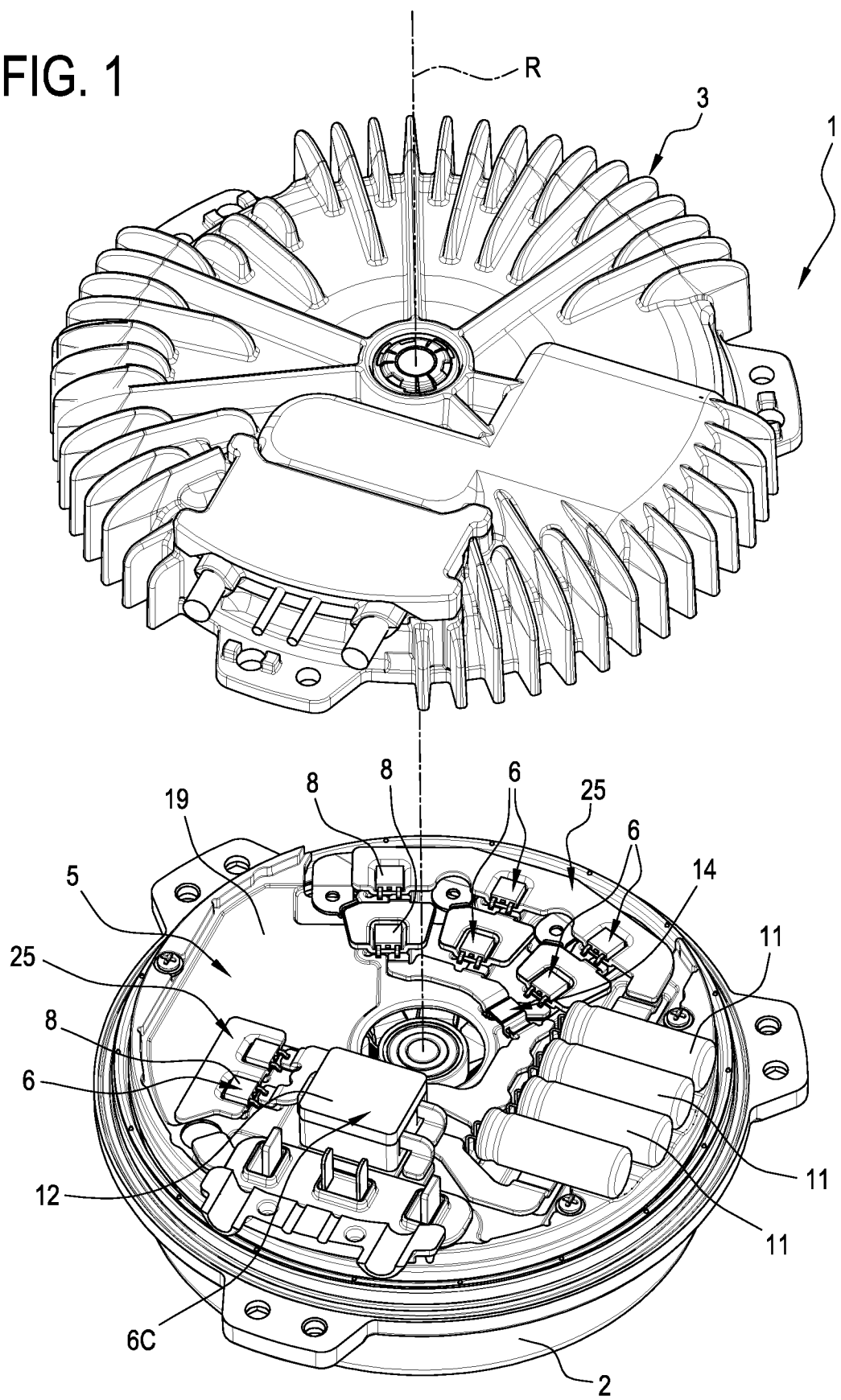
FIG. 1 illustrates a schematic exploded perspective view of a rotary electric machine in accordance with the invention with some parts cut away for greater clarity.

With reference to FIG. 1, the numeral 1 denotes a rotary electric machine according to this invention.

In the preferred embodiment of it, the machine 1 comprises an electric motor of the sealed type, that is to say without any opening giving access to the inside of it, to which this specification expressly refers but without losing in generality.

The electrical machine 1 will be described in detail solely for the parts necessary for the understanding of this invention.

The machine 1 comprises a casing 2 and a cap 3 for closing the casing 2 to form, with the casing 2, a case or closed container.

The casing 2 houses a stator, not illustrated, and a rotor, not illustrated, mounted rotatably about an axis of rotation R.

As illustrated in the accompanying drawings, the electric machine 1 comprises an electronic module 5, placed at least partly in the casing 2, for powering the electric winding of the rotor, not illustrated.

The electric machine 1 comprises a heat sink for dissipating the heat produced in the case, specifically the heat produced by the electronic module 5, defined by the cap 3 which closes the casing 2.

The electronic module 5 comprises a plurality of electronic components 6 such as, for example, the MOSFETs 8 for powering the motor, the capacitors 11, the filter inductor 12 and the shunt 14.

Each electronic component 6 has respective connecting pins 7.

Figure 2:
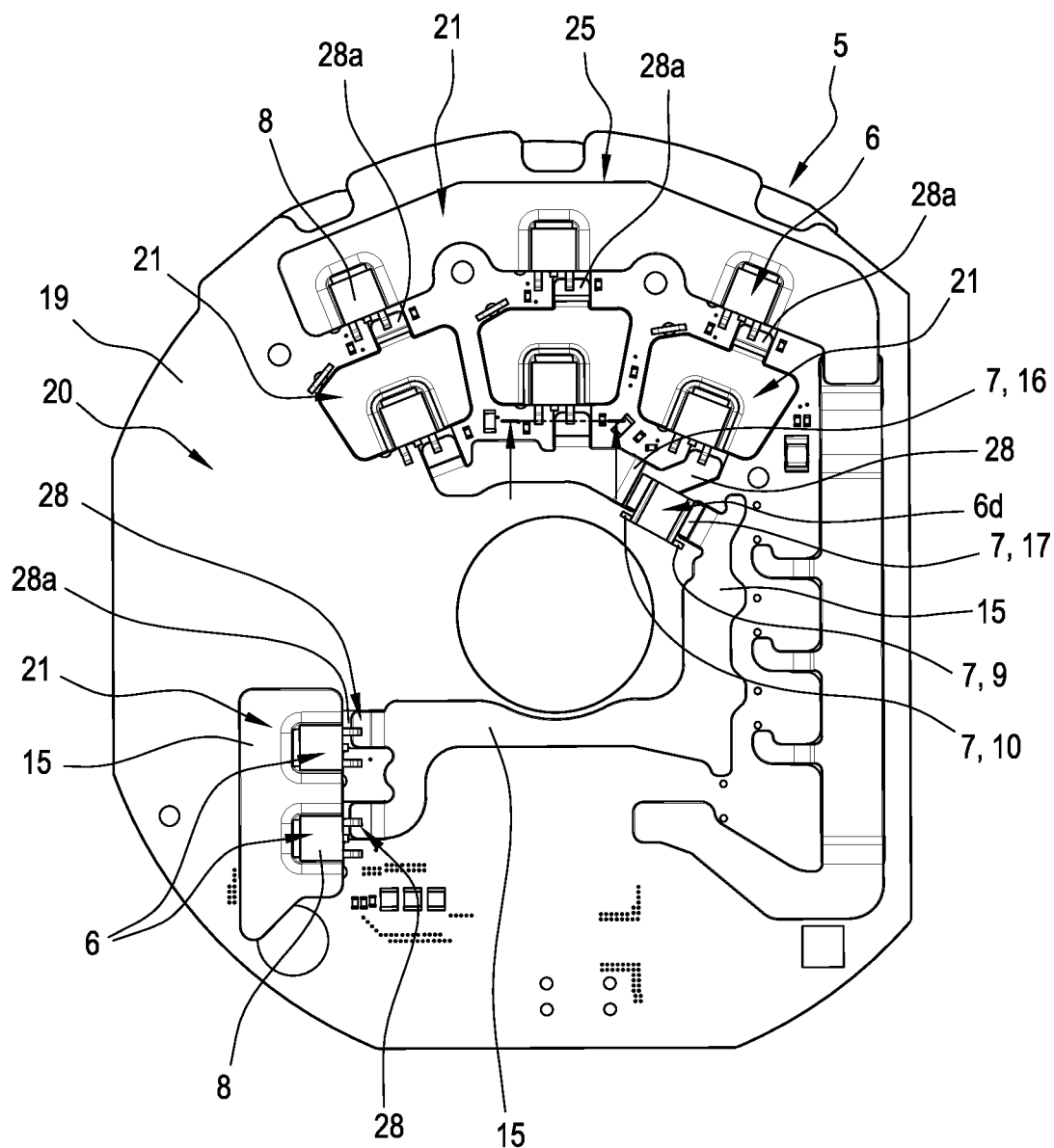
FIG. 2 is a schematic front view showing a detail of the electronic drive module of an electric machine in accordance with an aspect of this disclosure.

As illustrated in FIG. 2, the MOSFETs 8 are electronic components having a case which is substantially in the shape of a parallelepiped and equipped with respective connecting pins 7, specifically a first and a second connecting pin 9, 10.

In the same way, the capacitor 11 and the filter inductor 12 are provided with respective connecting pins 7, specifically a first and a second connecting pin 9, 10.

The shunt 14 is also provided with respective connecting pins 7, specifically a first, a second, a third and a fourth connecting pin 9, 10, 16, 17.

It should be noted that all the electronic components 6 of the electronic module 5 are disposed on the same side 20 of the electronic module 5, namely the first side 20 of the electronic module 5.

The first side 20 of the electronic module 5 faces the cap 3.

Figure 3:
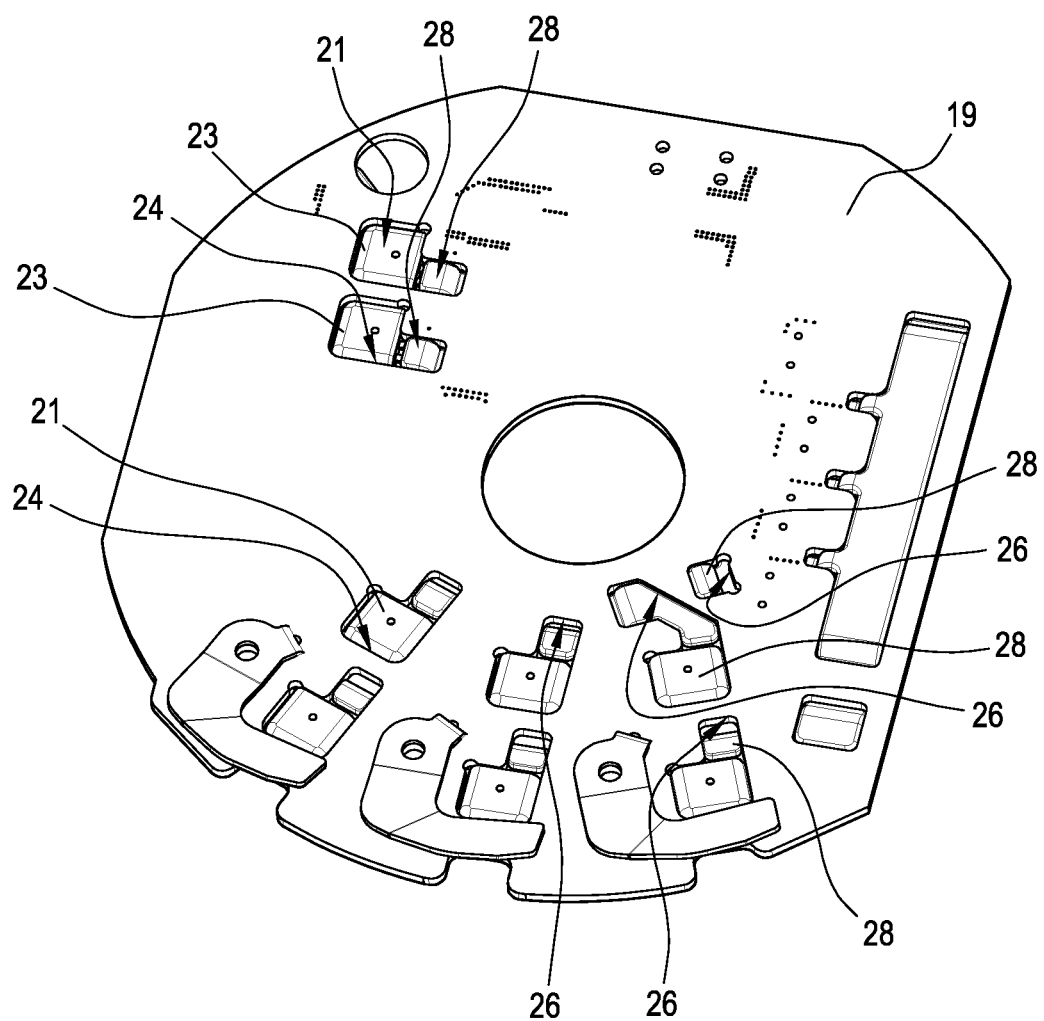
FIG. 3 illustrates the detail of FIG. 2 in a different schematic view.
Figure 4:
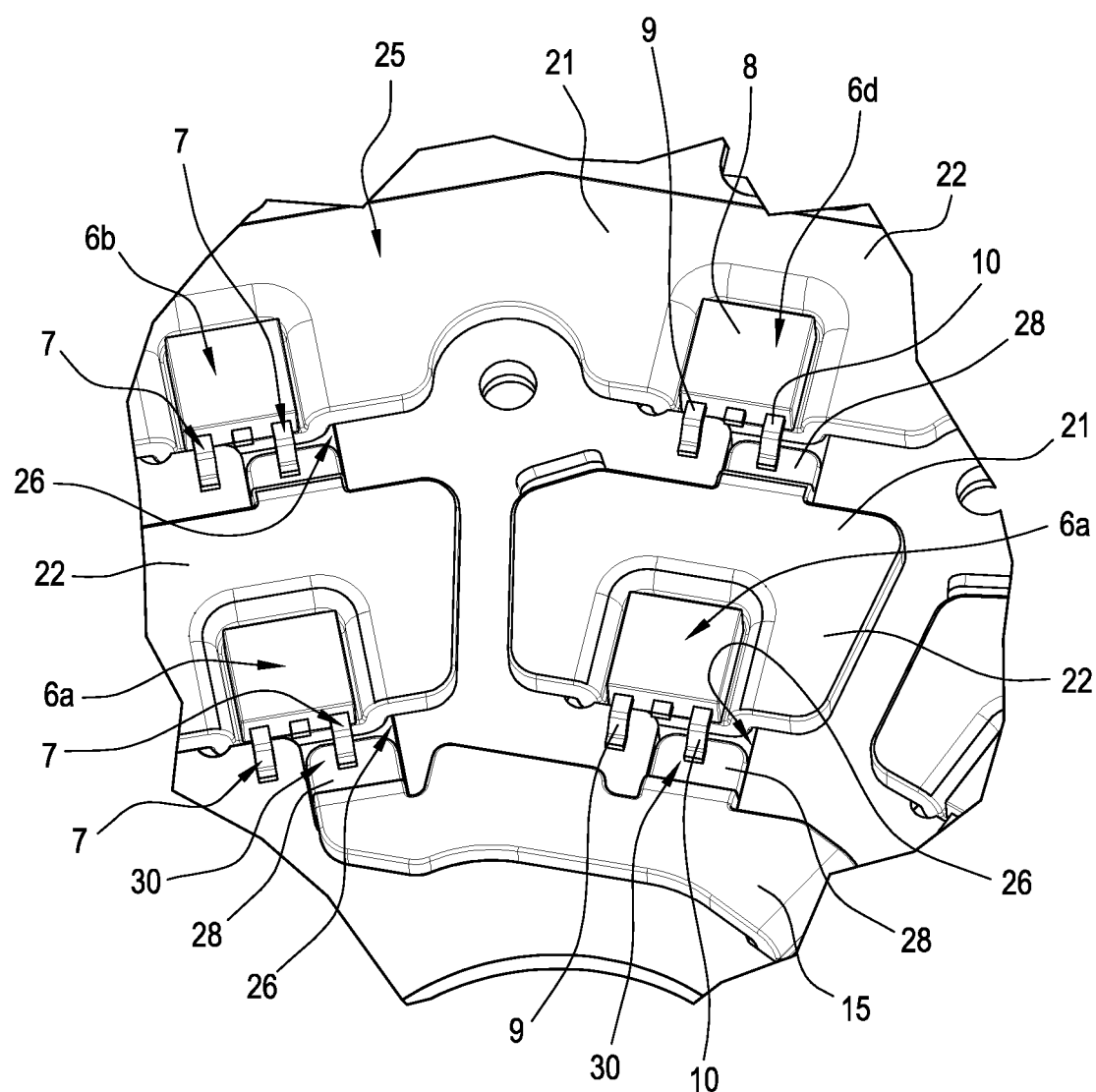
FIG. 4 is a scaled-up view of a detail from FIG. 2.

Looking in more detail at the electronic module 5, with reference to FIGS. 2 to 4, it should be noted that the electronic module 5 of the electric machine 1 comprises a printed circuit board 19.

The printed circuit board 19 is generally known by its acronym "PCB".

As illustrated, all the electronic components 6 are disposed on the component side 20 of the printed circuit board 19, which defines the first side 20 of the electronic module 5.

The component side 20 of the printed circuit board 19 is the top face of the printed circuit board 19 facing towards the cap 3.

The electronic module 5 also comprises a plurality of conductive tracks 25 which implement the electrical connections between the electronic components 6.

According to an aspect of this disclosure, the conductive tracks 25 are disposed only on the side 20 of the printed circuit board 19 on which the electronic components 6 are disposed, defined as the component side 20 of the printed circuit board 19.

The conductive tracks 25 comprise respective branches 15, which extend along a respective path on the component side 20 of the printed circuit board 19, and respective tabs 28 for connection to a respective pin 7 of the electronic component 6.

The branches 15 of the tracks 25 are placed in contact with the component side 20 of the printed circuit board 19.

In other words, the branches 15 of the tracks 25 extend from the printed circuit board 19 towards the cap 3 for a height equal to the respective thickness.

On the component side 20 of it, the printed circuit board 19 has a plurality of seats 26, each configured to house a respective tab 28, or first tab 28a, of the conductive track 25.

Each seat 26 is made only on the side 20 of the printed circuit board 19 on which the electronic components 6 are disposed.

The seat 26 of the tab 28 may be in the form of a through hole—see FIG. 3.

Alternatively, the seat 26 of the tab 28 may be in the form of a blind hole.

In this case, the depth of each seat 26 is such that the tab 28 housed therein is coplanar with the component side 20 of the printed circuit board 19.

Figure 5:
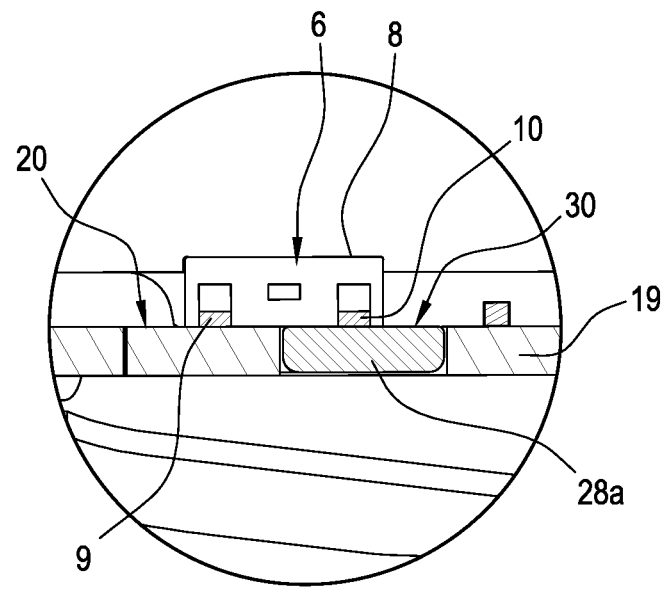
FIG. 5 is a schematic cross section showing a detail from FIG. 2 in accordance with an aspect of this disclosure.

More precisely, each tab 28 has a top face 30 which, given the housing depth of the respective seat 26, is coplanar with the component side 20 of the printed circuit board 19—see FIGS. 4 and 5.

Advantageously, the presence of seats 26 in the printed circuit board 19 to house the tabs 28 for connection to the pins 7 of the electronic components 6 connected ensures the pins 7 are coplanar to allow correctly assembling the components 6.

Figure 6:
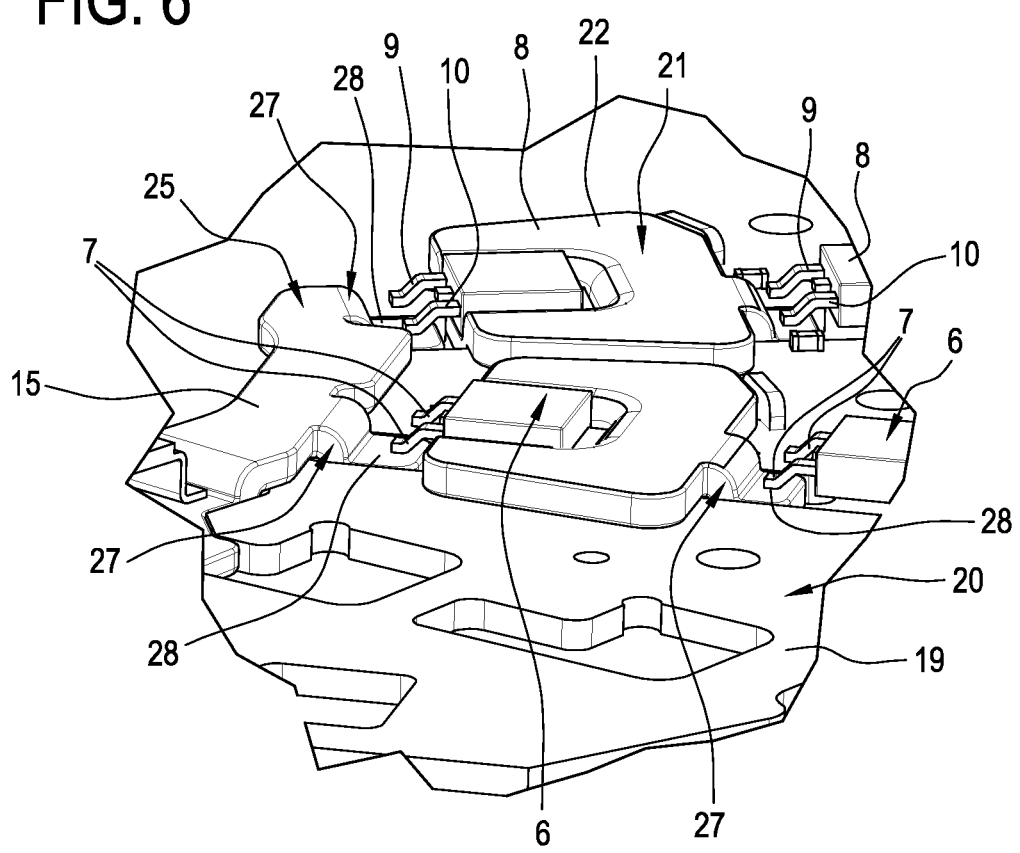
FIG. 6 is a schematic perspective view showing a detail from FIG. 2 in accordance with an aspect of this disclosure.

Since the tab 28 of the track 25 is coplanar with the component side 20 of the printed circuit board 19, that is, it lies in a horizontal plane, and the branch 15 of the conductive track is disposed on the side 20 of the printed circuit board 19, the conductive track 25 comprises a connecting element 27 for connecting the tab 28 to a respective branch 15—see FIG. 6.

In other words, the connecting element 27 compensates for the difference in height between the branch 15 of the track 25 and the tab 28 disposed in the respective seat 26 of the printed circuit board 19.

Each electronic component 6 has one or more pins 7 connected to a respective tab 28.

Each of the MOSFETs 8 has one pin 7, the first pin 9, connected to the component side 20 of the printed circuit board 19, and one pin 7, the second pin 10, connected to a respective tab 28.

Advantageously, the coplanarity between the tab 28 of the conductive track 25 and the component side 20 of the printed circuit board 19 guarantees correct assembly of the MOSFETs 8 on the printed circuit board 19.

According to a further aspect of this disclosure, the tab 28 to which the second pin 10 of the MOSFET 8, or first electronic component 6a, is connected, extends from a respective heat transfer device 21 of an electronic component 6, or MOSFET 8, associated therewith.

More precisely, the heat transfer device 21 referred to is known to the present Applicant and comprises a top portion 22 and a base portion 23 connected to the base portion 22.

The base portion 23 of a respective heat transfer device 21 is disposed in the printed circuit board 19 at least partly under the electronic component 6, specifically of the respective MOSFET 8.

The top portion 22 extends from the printed circuit board 19 towards the cap 3 and at least partly surrounds the base portion 23, leaving one side free at the pins 7 for connection of the electronic component 6.

In practice, each MOSFET 8 is surrounded on three sides by the top portion 22 of the heat transfer device.

The printed circuit board 19 comprises a seat 24 to house a base portion 23 of the respective transfer device 21 whilst, as mentioned, the top portion 22 is located above the printed circuit board 19, on the side 20 of the components 6.

In the embodiment like the one illustrated, for example, in FIG. 3, the seat 24 is in the form of a through hole in the printed circuit board 19.

The tab 28 which extends from a respective heat transfer device 21 is connected, in particular, to the top portion 22 of the heat transfer device 21.

More specifically, the part extending from the top portion 22 of the heat transfer device is the connecting element 27 of the tab 28 housed in the respective seat 26.

It should be noted that according to this disclosure, the heat transfer device 21 is an integral part of a respective conductive track 25 comprising the tab 28 which extends from the top portion 22 of the heat transfer device 21 by its connecting element 27.

In practice, the heat transfer device 21 is made of a thermally and electrically conductive material.

Preferably, in order to optimize the spaces for the electronic components 6 on the printed circuit board 19, the heat transfer device 21 from which the respective tab 28 extends is disposed in front of an electronic component 6, or second component 6b, connected to the tab 28 itself.

Also imaginable, however, is the possibility of not disposing the electronic component 6 in front of the heat transfer device 21 from which the tab 28, connecting the component itself, extends.

The electronic module 5 according to this disclosure comprises an electronic component 6, or third electronic component 6c, whose pins 7 are connected to respective distinct branches 15, such as, for example, the inductor 12.

The shunt 14, or fourth electronic component 6d, has two pins 7 connected to the printed circuit board 19, namely the first and second pins 9, 10, and two pins 7, namely the third and fourth pins 11, 12, connected to respective tabs 28, each disposed in a respective seat 26.

To enable different electronic components 6 to be electrically connected to each other, the electronic module 5 according to this disclosure comprises one or more conductive tracks 25 from which respective tabs 28 extend, each used to connect a respective electronic component 6.

In other words, one conductive track 25 extends along the printed circuit board 19 to connect a plurality of pins 7 belonging to distinct electronic components 6 by means of respective tabs 28.

Finally, it should be noted that the heat generated by the conductive tracks 25 is disposed of through the cap 3 through a thermally conductive and electrically insulating paste, "thermally conductive gap filler", placed between the surface of the conductive track 25 and the cap 3.

In the same way, the heat generated by the heat transfer device 21 of an electronic component 6 is disposed of through the cap 3 by means of a thermally conductive and electrically insulating paste, "thermally conductive gap filler", placed between the surface of the transfer device 21 and the cap 3.

The invention claimed is:

1. A rotary electrical machine comprising:
an electronic module comprising a printed circuit board and a plurality of electronic components, each of which includes respective connecting pins disposed on a component side of the printed circuit board;
the electronic module comprising a conductive track which comprises a plurality of tabs, each configured to be connected to one of the respective connecting pins;
wherein the conductive track is positioned on the component side of the printed circuit board; the printed circuit board including a seat configured to house a first tab of the plurality of tabs in such a way that a top face of the first tab is coplanar with the component side of the printed circuit board,
wherein the conductive track comprises a branch disposed on the component side of the printed circuit board and a connecting element for connecting the first tab to the branch; the connecting element being configured to compensate for a difference in height between the branch and the first tab disposed in the seat of the conductive track.

2. The machine according to claim 1, wherein the seat is a through hole in the printed circuit board.

3. The machine according to claim 1, wherein the seat is a blind hole in the printed circuit board.

4. The machine according to claim 1, wherein the electronic module comprises a heat transfer device associated with a first one of the plurality of electronic components, which is a MOSFET; the conductive track comprising the heat transfer device, which defines the branch, and the first tab extending from the heat transfer device.

5. The machine according to claim 4, wherein the heat transfer device comprises a base portion, on which the first one of the plurality of electronic components is disposed, and a top portion, which at least partly surrounds the first one of the plurality of electronic components; the conductive track comprising a connecting element for connecting the tab with the top portion of the heat transfer device.

6. The machine according to claim 4, wherein the electronic module comprises a second one of the plurality of electronic components with which a respective heat transfer device is associated; the second one of the plurality of electronic components including a pin of the respective connecting pins being connected to the first tab.

7. The machine according to claim 6, wherein the first and second ones of the electronic components, with which the respective heat transfer device is associated, include respective first pins of the respective connecting pins connected to the printed circuit board and respective second pins of the respective connecting pins connected to respective first tabs, with the first and second ones of the electronic components being MOSFETs.

8. The machine according to claim 7, wherein the first and the second ones of the plurality of electronic components are disposed in front of one another.

9. The machine according to claim 1, wherein the electronic module comprises a third one of the plurality of electronic components comprising certain ones of the respective connecting pins connected to respective branches which are distinct from each other.

10. The machine according to claim 1, wherein the electronic module comprises a fourth one of the plurality of electronic components comprising a first two pins of the respective connecting pins connected to the printed circuit board and a further two pins of the respective connecting pins connected to respective first tabs, each housed in an individual seat.

11. A rotary electrical machine comprising:
an electronic module comprising a printed circuit board and a plurality of electronic components, each of which includes respective connecting pins disposed on a component side of the printed circuit board;
the electronic module comprising a conductive track which comprises a plurality of tabs, each configured to be connected to one of the respective connecting pins;
wherein the conductive track is positioned on the component side of the printed circuit board; the printed circuit board including a seat configured to house a first tab of the plurality of tabs in such a way that a top face of the first tab is coplanar with the component side of the printed circuit board,
wherein the electronic module comprises a heat transfer device associated with a first one of the plurality of electronic components, which is a MOSFET; the conductive track comprising the heat transfer device, which defines the branch, and the first tab extending from the heat transfer device,
wherein the heat transfer device comprises a base portion, on which the first one of the plurality of electronic components is disposed, and a top portion, which at least partly surrounds the first one of the plurality of electronic components; the conductive track comprising a connecting element for connecting the tab with the top portion of the heat transfer device.

12. A rotary electrical machine comprising:
an electronic module comprising a printed circuit board and a plurality of electronic components, each of which includes respective connecting pins disposed on a component side of the printed circuit board;
the electronic module comprising a conductive track which comprises a plurality of tabs, each configured to be connected to one of the respective connecting pins;
wherein the conductive track is positioned on the component side of the printed circuit board; the printed circuit board including a seat configured to house a first tab of the plurality of tabs in such a way that a top face of the first tab is coplanar with the component side of the printed circuit board,
wherein the electronic module comprises a heat transfer device associated with a first one of the plurality of electronic components, which is a MOSFET; the conductive track comprising the heat transfer device, which defines the branch, and the first tab extending from the heat transfer device,
wherein the electronic module comprises a second one of the plurality of electronic components with which a respective heat transfer device is associated; a pin of the second one of the plurality of electronic components being connected to the first tab.

* * * * *